(12) United States Patent
Tajima et al.

(10) Patent No.: US 9,570,514 B2
(45) Date of Patent: Feb. 14, 2017

(54) SEMICONDUCTOR DEVICE (71) Applicant: Kabushiki Kaisha Toshiba, Minato-ku (JP)

(72) Inventors: Hikari Tajima, Koganei (JP); Masaki Kondo, Yokkaichi (JP); Tsukasa Nakai, Yokkaichi (JP); Takashi Izumida, Yokohama (JP); Nobuaki Yasutake, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/483,632

(22) Filed: Sep. 11, 2014

(65) Prior Publication Data

US 2015/0357379 A1 Dec. 10, 2015

Related U.S. Application Data

(60) Provisional application No. 62/008,596, filed on Jun. 6, 2014.

(51) Int. Cl.
*H01L 47/00* (2006.01)
*H01L 27/24* (2006.01)
(Continued)

(52) U.S. Cl.
CPC ......... *H01L 27/2454* (2013.01); *H01L 27/228* (2013.01); *H01L 27/249* (2013.01);
(Continued)

(58) Field of Classification Search
CPC .................. H01L 27/11582; H01L 2924/0002; H01L 27/11556; H01L 27/11573; H01L 29/7926; H01L 27/11524; H01L 27/1222; H01L 27/1259; H01L 29/42384; H01L 29/66787; H01L 29/785; H01L 29/78642; H01L 29/78696

See application file for complete search history.

(56) References Cited

U.S. PATENT DOCUMENTS 7,402,862 B2 * 7/2008 Choi ................... H01L 29/4232
257/314
8,089,301 B2 1/2012 Kim et al.
(Continued)

FOREIGN PATENT DOCUMENTS

JP 2003-229494 8/2003
JP 2005-64031 3/2005
(Continued)

*Primary Examiner* — Cuong Q Nguyen
*Assistant Examiner* — Nishath Yasmeen
(74) *Attorney, Agent, or Firm* — Oblon, McClelland, Maier & Neustadt, L.L.P.

(57) ABSTRACT

According to an embodiment, a semiconductor device includes two electrodes extending in a first direction, a semiconductor layer provided between the two electrodes, an insulating film disposed between the two electrodes. The two electrodes are arranged in a second direction intersecting the first direction. The semiconductor layer extends in a third direction orthogonal to the first direction and the second direction. The insulating film covers a side surface of the semiconductor layer opposite to one of the two electrodes. The semiconductor layer has a shape in a cross section perpendicular to the third direction such that a width in the first direction at a center of the cross section is narrower than a width, in the first direction, of the side surface.

9 Claims, 7 Drawing Sheets

(51) Int. Cl.
    *H01L 29/78*         (2006.01)
    *H01L 45/00*         (2006.01)
    *H01L 27/22*         (2006.01)

(52) U.S. Cl.
    CPC .......... *H01L 29/7827* (2013.01); *H01L 45/04* (2013.01); *H01L 45/1226* (2013.01); *H01L 45/145* (2013.01); *H01L 45/146* (2013.01); *H01L 45/148* (2013.01); *H01L 45/149* (2013.01)

(56) References Cited

U.S. PATENT DOCUMENTS

| | | |
|---|---|---|
| 2003/0116803 A1 | 6/2003 | Park |
| 2005/0035399 A1 | 2/2005 | Masuoka et al. |
| 2007/0252180 A1 | 11/2007 | Ono |
| 2011/0303972 A1 | 12/2011 | Saitoh et al. |
| 2012/0161094 A1* | 6/2012 | Huo .................... H01L 27/249 257/4 |
| 2013/0009161 A1 | 1/2013 | Himori |
| 2013/0313610 A1* | 11/2013 | Sell ................... H01L 21/02532 257/192 |

FOREIGN PATENT DOCUMENTS

| | | |
|---|---|---|
| JP | 2007-294680 | 11/2007 |
| JP | 5073014 B2 | 11/2012 |
| JP | 2013-16611 | 1/2013 |
| WO | WO2013/095550 * | 6/2013 |

* cited by examiner

SEMICONDUCTOR DEVICE

CROSS-REFERENCE TO RELATED APPLICATIONS

This application is based upon and claims the benefit of priority from U.S. Provisional Patent Application 62/008,596 filed on Jun. 6, 2014; the entire contents of which are incorporated herein by reference.

FIELD

Embodiments are generally related to a semiconductor device.

BACKGROUND

Semiconductor devices have various structures. For example, there are transistors that are used in LSIs (Large Scale Integrated circuits) integrated two-dimensionally, semiconductor memory, etc. For even higher integration of such semiconductor devices, semiconductor devices having three-dimensional structures are being considered. Also, there are cases where a vertical transistor is used as a selection element in semiconductor devices that has three-dimensional structures.

DETAILED DESCRIPTION

According to an embodiment, a semiconductor device includes two electrodes extending in a first direction, a semiconductor layer provided between the two electrodes, an insulating film disposed between the two electrodes. The two electrodes are arranged in a second direction intersecting the first direction. The semiconductor layer extends in a third direction orthogonal to the first direction and the second direction. The insulating film covers a side surface of the semiconductor layer opposite to one of the two electrodes. The semiconductor layer has a shape in a cross section perpendicular to the third direction such that a width in the first direction at a center of the cross section is narrower than a width, in the first direction, of the side surface.

Embodiments will now be described with reference to the drawings. Similar portions in the drawings are marked with like numerals and a detailed description is omitted as appropriate; and portions that are different are described. The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the examples hereinbelow, the dispositions and configurations of the components are described referring to an X-direction, a Y-direction, and a Z-direction of an orthogonal coordinate system shown in the drawings. Here, a first direction is taken to be the Y-direction; a second direction is taken to be the X direction; and a third direction is taken to be the Z direction. Also, there are cases where the Z-direction is described as upward and the opposite direction is described as downward.

[First Embodiment]

Figure 1:
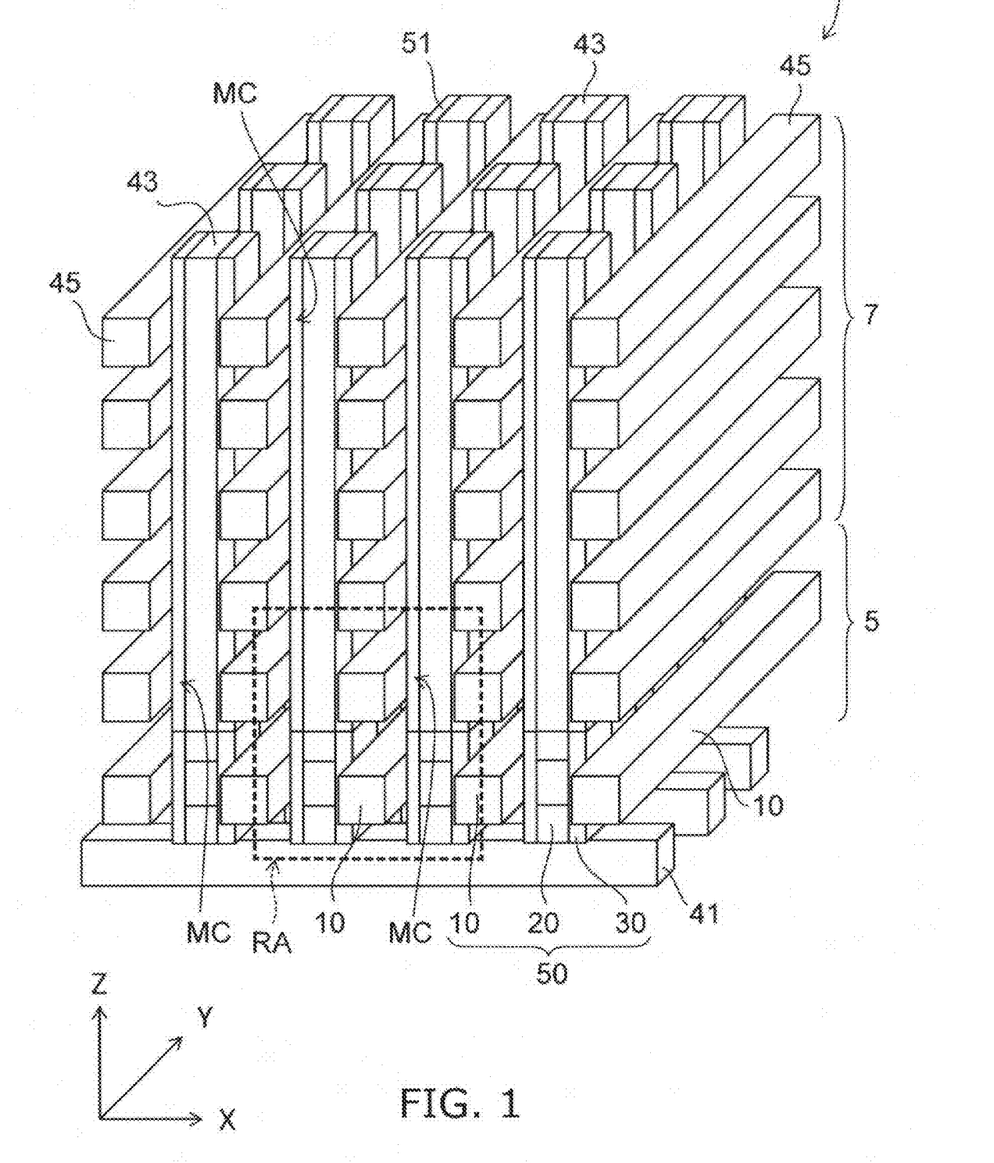
FIG. 1 is an example of a perspective view schematically showing a semiconductor device according to a first embodiment.

FIG. 1 is a perspective view schematically showing a semiconductor device 1 according to an embodiment. In FIG. 1, the insulating films provided between the components are not shown for easier viewing of the structure of the semiconductor device 1.

The semiconductor device 1 is, for example, a nonvolatile memory device and includes a transistor array 5 and a memory cell array 7 provided on a not-shown underlying layer. As shown in FIG. 1, the memory cell array 7 has a three-dimensional structure and is provided on the transistor array 5.

The transistor array 5 includes two control electrodes 10 extending in the Y-direction, and a plurality of semiconductor layers 20 having substantially columnar configurations. The semiconductor layers 20 are provided between the two control electrodes 10. The semiconductor layers 20 are disposed to be arranged in the Y-direction between the two control electrodes. Each of the semiconductor layers 20 extends in the Z-direction.

The transistor array 5 further includes an insulating film 30 filled into the space between the two control electrodes 10. The insulating film 30 covers side surfaces 20s of the semiconductor layer 20 between the two control electrodes 10 (referring to FIG. 3A).

As shown in FIG. 1, the transistor array 5 is provided on a plurality of first interconnects (herein below, global bit lines 41). The global bit lines 41 extend in the X-direction. Also, the global bit lines 41 are disposed to be arranged in the Y-direction. Also, the semiconductor layers 20 that are included in the transistor array 5 are provided respectively on different global bit lines 41.

The memory cell array 7 includes a plurality of second interconnects (hereinbelow, local bit lines 43) and a plurality of third interconnects (hereinbelow, word lines 45). The local bit lines 43 extend in the Z-direction. Each of the local bit lines 43 is connected to one of the semiconductor layers 20. On the other hand, the word lines 45 extend in the Y-direction and are provided between the local bit lines 43 adjacent to each other in the X-direction.

Figure 2:
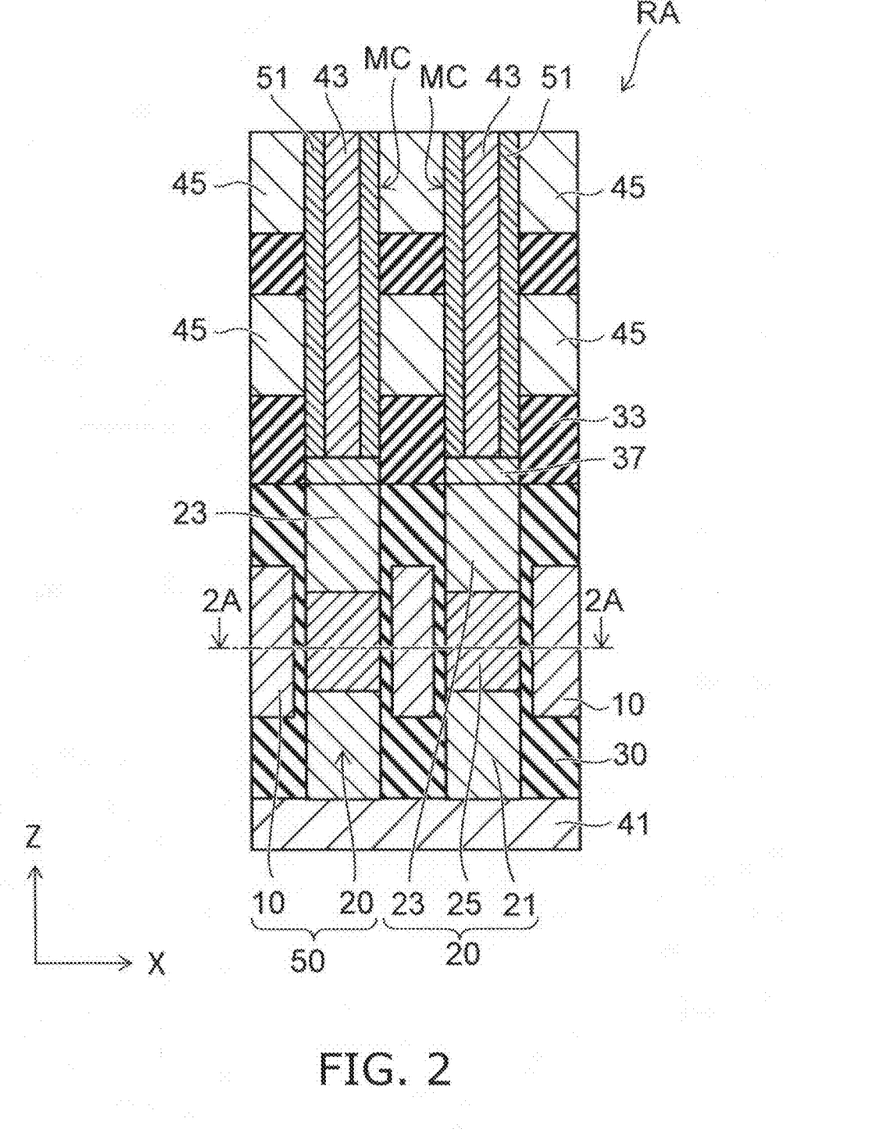
FIG. 2 is an example of a cross-sectional view schematically showing a vertical transistor according to the first embodiment.

As shown in FIG. 1, the word lines 45 are stacked in the Z-direction with an insulating film 33 interposed (referring to FIG. 2). Also, the memory cell array 7 includes memory cells MC provided between each of the local bit lines 43 and the word lines 45.

For example, as shown in FIG. 1, a memory film 51 is provided along the side surfaces of the local bit lines 43. Thereby, the memory cells MC for which the memory film 51 is interposed between two interconnects are formed at the portions where the local bit lines 43 and the word lines 45 intersect. Also, the memory cell array 7 is configured to include a plurality of memory cells MC disposed three-dimensionally.

The memory film 51 is, for example, a variable resistance film. The memory film 51 transitions reversibly from a first resistance value to a second resistance value due to a voltage applied between the local bit lines 43 and the word lines 45 or a current flowing between the local bit lines 43 and the word lines 45.

The memory film 51 has, for example, a major component of an oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), and niobium (Nb). For example, the resistance change material is a thin film including a material such as $HfO_2$, $Al_2O_3$, $TiO_2$, NiO, $WO_3$, $Ta_2O_5$, etc. Also, the resistance value of the resistance change material can be reversibly changed by causing a prescribed current to flow or by applying a prescribed voltage.

Also, an ion-type variable resistance film can be used. For example, the memory film 51 may include monocrystalline or polycrystalline Si, Ge, SiGe, GaAs, InP, GaP, GaInAsP, GaN, SiC, HfSi, HfO, AlO, a stacked film of these materials, etc. In such a case, for example, Ag, Au, Ti, Ni, Co, Al, Fe, Cr, Cu, W, Hf, Ta, Pt, Ru, Zr, Ir, a nitride or a carbide of these elements, etc., can be disposed as an electrode between the local bit line 43 and the memory film 51 or between the word line 45 and the memory film 51. Also, a material in which the materials recited above are added to polycrystalline silicon (polysilicon) also can be used as the electrode. Also, a stopper layer of TaSiN may be inserted on the side of the memory film 51 opposite to the electrode.

A vertical transistor 50 according to the embodiment will now be described referring to FIG. 2. FIG. 2 is an example of a cross-sectional view schematically showing the vertical transistor 50 according to the embodiment. FIG. 2 shows a cross section parallel to the X-Z plane of region RA of FIG. 1.

The vertical transistor 50 includes the control electrode 10 and the semiconductor layer 20. The semiconductor layer 20 includes two source-drain portions 21 and 23 (diffusion layer portions) provided to be arranged in the Z-direction and a channel portion 25. The channel portion 25 is provided between the two source-drain portions 21 and 23. The control electrode 10 is provided to oppose the channel portion 25 with the insulating film 30 interposed. In other words, the control electrode 10 is in contact with the channel portion 25 via the insulating film 30.

The source-drain portion 21 is electrically connected to the global bit line 41. On the other hand, the source-drain portion 23 is electrically connected to the local bit line 43. Here, being electrically connected is not limited to the case where the "components that are connected" are directly connected to each other, and may include the case of being connected via another component.

For example, in the example shown in FIG. 2, the source-drain portion 23 is electrically connected to the local bit line 43 via a barrier layer 37. The barrier layer 37 has, for example, a stacked structure of titanium nitride (TiN) and titanium silicide (TiSi). The titanium silicide contacts the source-drain portion 23 and reduces the contact resistance with the source-drain portion 23. The titanium nitride suppresses the diffusion of metal atoms from the local bit line 43 side to the vertical transistor 50.

As shown in FIG. 1 and FIG. 2, a plurality of vertical transistors 50 are provided on one global bit line 41 extending in the X-direction. Also, the vertical transistors 50 control the conduction between the global bit line 41 and the local bit lines 43.

In the example, one control electrode 10 is provided between two mutually-adjacent semiconductor layers 20 of the semiconductor layers 20 arranged on the global bit line 41. Thus, the control electrode 10 is shared by two mutually-adjacent vertical transistors 50. For example, one of the vertical transistors 50 may be switched to the on-state by applying a gate bias to two control electrodes 10 provided on two sides of one semiconductor layer 20. Thereby, the global bit line 41 and the local bit line 43 connected to the vertical transistor 50 in the on-state can be caused to electrically conduct. In other words, one of the local bit lines 43 connected via the vertical transistors 50 to one global bit line 41 can be selected. Then, it is possible to access any of the memory cells MC provided along the local bit line 43 that is selected.

For example, in the case where data is programmed to the memory cell MC, the local bit line where the memory cell MC is provided is selected; and a current is caused to flow in the memory film 51 via the vertical transistor 50. Thereby, the resistance state can be changed in the memory film 51. To cause a current that is sufficient for the resistance change (i.e. the switching) of the memory film 51 to flow, it is favorable for the on-current ($I_{ON}$) of the vertical transistor 50 to be large. Also, it is desirable to reduce the off-current ($I_{OFF}$) of the vertical transistor 50 to suppress the current flowing in the local bit lines 43 that are not selected and avoid various disturbances.

For example, it is desirable for an n-channel transistor having a large on-current to be used as the vertical transistor 50. In the case where polysilicon is used as the material of the semiconductor layer 20, the source-drain portions 21 and 23 may be n-type silicon; and the channel portion 25 may be p-type silicon. Also, the source-drain portions 21 and 23 may be $n^+$-type silicon; and the channel portion 25 may be $n^-$-type silicon.

Further, in the embodiment, the off-current of the vertical transistor 50 is suppressed by setting the configuration of the cross section (the cross section of the channel portion 25) of the semiconductor layer 20 perpendicular to the Z-direction to be favorable. Relationships between the off-current and several examples of the cross-sectional configuration of the semiconductor layer will now be described.

(First Example)

Figure 3A:
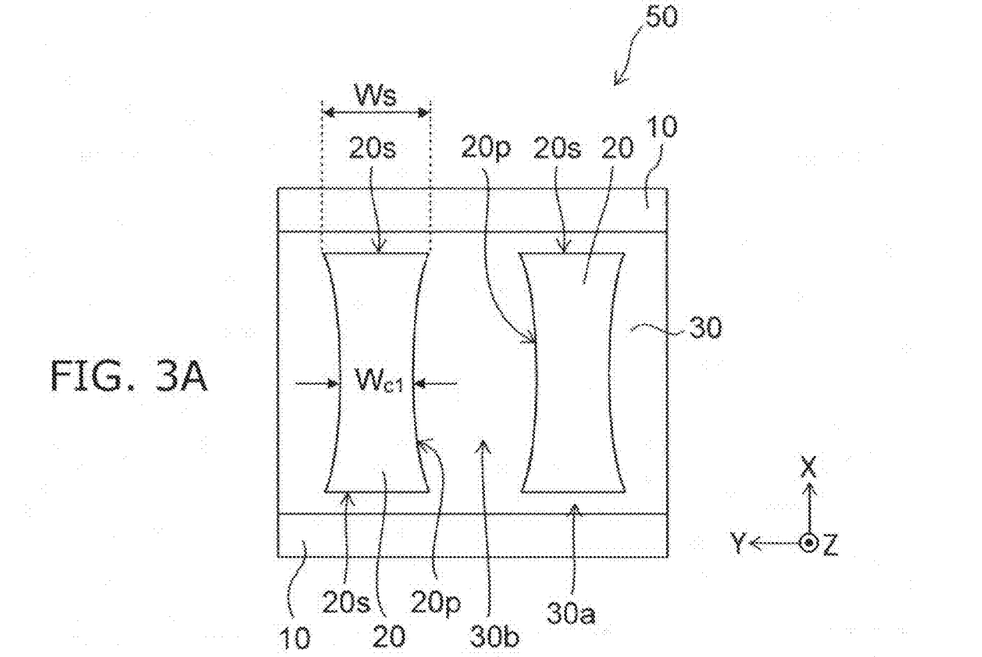
FIGS. 3A and 3B are examples of a cross-sectional view schematically showing the semiconductor layer of the vertical transistor according to the first embodiment.

FIG. 3A is an example of a cross-sectional view schematically showing the semiconductor layer 20 of the vertical transistor 50 according to the embodiment. FIG. 3A shows a portion of the cross section along line 2A-2A shown in FIG. 2. In other words, the cross section perpendicular to the extension direction (the Z-direction) of the semiconductor layer 20 is shown.

As shown in FIG. 3A, the semiconductor layers 20 are provided to be arranged in the Y-direction between two control electrodes 10. The insulating film 30 is formed in the space between the two control electrodes 10 adjacent to each other in the X-direction other than the portions occupied by the semiconductor layers 20.

The insulating film 30 includes a first portion 30a that is provided between the semiconductor layers 20 and the control electrodes 10, and a second portion 30b that is provided between two semiconductor layers 20 adjacent to each other in the Y-direction. The first portion 30a serves as a gate insulator film. The second portion 30b electrically insulates the two mutually-adjacent semiconductor layers 20. For example, the width of the second portion 30b in the Y-direction is provided to be wider than the width of the first portion 30a in the X-direction.

The cross section of the semiconductor layer 20 shown in FIG. 3A includes the side surface 20s that is in contact with the control electrode 10 via the insulating film 30. In other words, the cross section shown in FIG. 3A also is a cross section of the channel portion 25. Further, the cross section of the semiconductor layer 20 includes other side surfaces 20p contacting the side surface 20s. In other words, the cross section of the semiconductor layer 20 has a configuration enclosed with the two side surfaces 20s that respectively oppose the two control electrodes 10 and with the two side surfaces 20p that contact the side surfaces 20s. Also, the side surface 20p has a concave surface recessed in the central direction of the semiconductor layer 20. The concave surface may be provided at least one of the side surfaces 20p.

As shown in FIG. 3A, the semiconductor layer 20 is provided to have a configuration in which the width in the Y-direction becomes narrower from the side surface 20s toward the center of the semiconductor layer 20 in the cross section perpendicular to the Z-direction. In other words, a width $W_S$ of the side surface 20s is wider than a width $W_{C1}$ of the center. In other words, the cross section of the semiconductor layer 20 is provided so that the width in the Y-direction becomes narrower from the side surface 20s toward the center.

(Second Example)

Figure 3B:
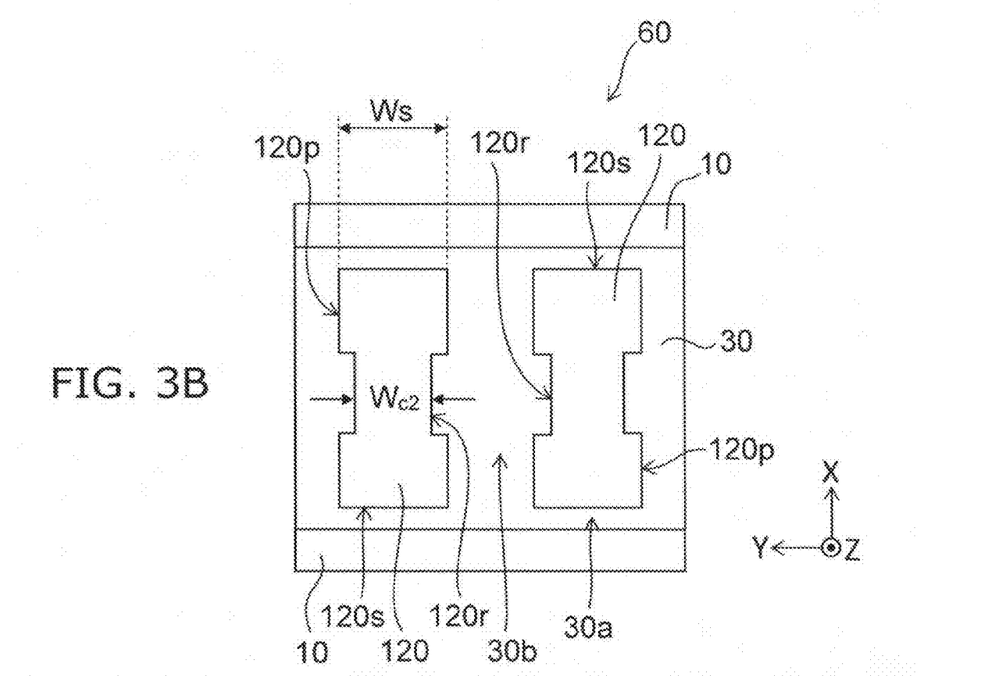

FIG. 3B is an example of a cross-sectional view schematically showing a semiconductor layer 120 of a vertical transistor 60 which is a variation of the vertical transistor 50. FIG. 3B shows a portion of a cross section along line 2A-2A shown in FIG. 2. In other words, a cross section perpendicular to the extension direction (the Z-direction) of the semiconductor layer 120 is shown.

The vertical transistor 60 shown in FIG. 3B includes the semiconductor layer 120. The semiconductor layers 120 are provided to be arranged in the Y-direction between the two control electrodes 10. The insulating film 30 is formed in the space between two control electrodes 10 adjacent in the X-direction other than the portions occupied by the semiconductor layers 120.

The cross section of the semiconductor layer 120 has a configuration enclosed with two side surfaces 120s and two side surfaces 120p. Each of the two side surfaces 120s is in contact with one of the two control electrodes 10 via the insulating film 30. In other words, the side surface 120s opposes the control electrode 10 with the insulating film 30 interposed. Also, each of the two side surfaces 120p contacts the side surfaces 120s and includes a recessed portion 120r at the central vicinity in the X-direction. The recessed portion 120r may be provided in at least one of the side surfaces 120p.

As shown in FIG. 3B, the semiconductor layer 20 is provided so that a width $W_{C2}$ in the Y-direction of the portion where the recessed portion 120r is provided is narrower than the width $W_S$ in the Y-direction of the side surface 20s. In other words, in the X-direction, the width $W_S$ of the side surface 20s is wider than the width $W_{C2}$ of the center.

Figure 4A:
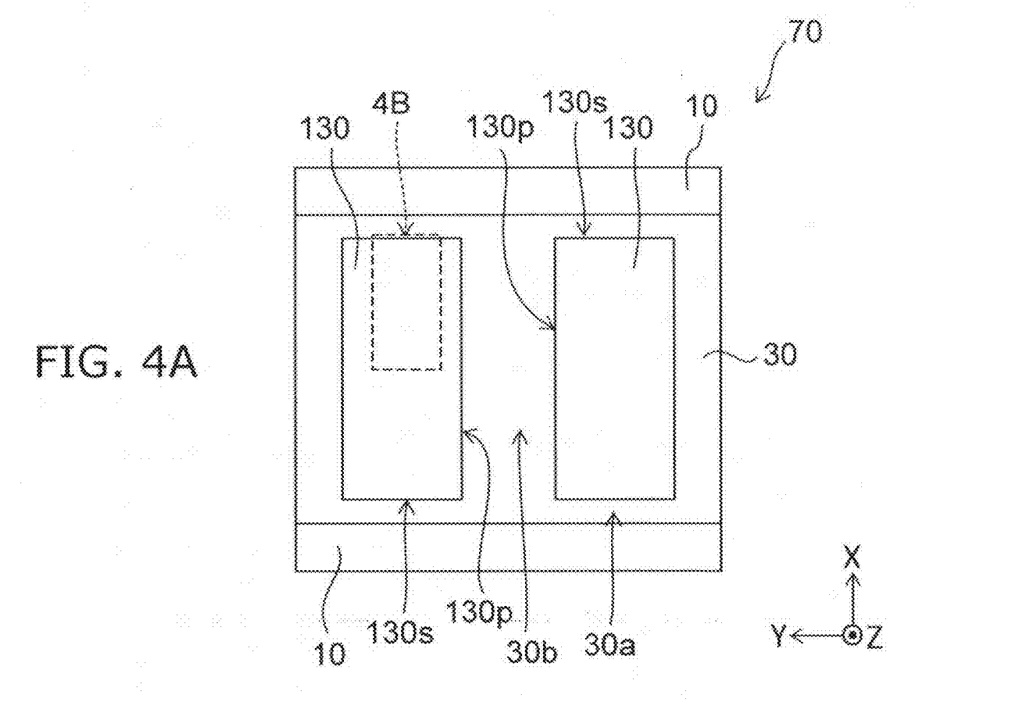
FIGS. 4A and 4B are a cross-sectional view and a carrier distribution showing a semiconductor layer of a vertical transistor according to a comparative example.
Figure 4B:
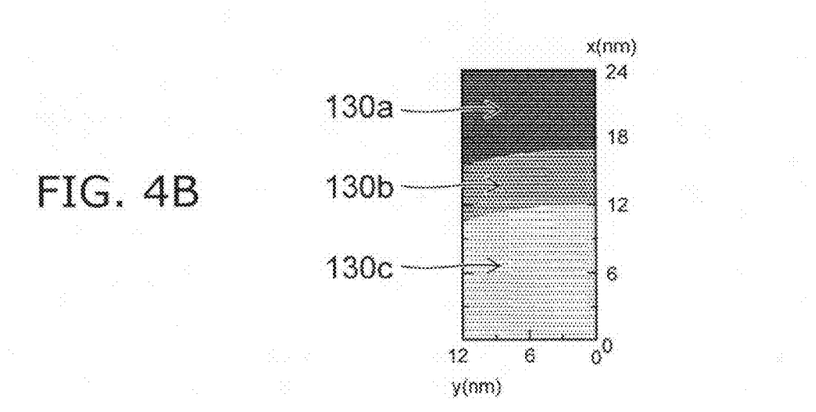

FIG. 4A is a cross-sectional view showing a semiconductor layer 130 of a vertical transistor 70 according to a comparative example. FIG. 4B is a cross-sectional view schematically showing the carrier distribution of the semiconductor layer 130.

As shown in FIG. 4A, the semiconductor layers 130 are provided to be arranged in the Y-direction between two control electrodes 10. The insulating film 30 is formed in the space between the two control electrodes 10 other than the portions occupied by the semiconductor layers 130.

The cross section of the semiconductor layer 130 has a configuration enclosed with two side surfaces 130s and two side surfaces 130p. Each of the two side surfaces 130s is in contact with one of the two control electrodes 10 via the insulating film 30. Also, each of the two side surfaces 130p contacts the side surfaces 130s. As shown in FIG. 4A, the cross section of the semiconductor layer 130 is a rectangle; and the width in the Y-direction of the cross section is uniform.

FIG. 4B shows, for example, the simulation result of the electron density of region 4B shown in FIG. 4A. For example, the semiconductor layer 130 is p-type silicon; and the insulating film 30 is a silicon oxide film. The potential of the control electrode 10 is 0 (zero) V; and the potential difference between the source-drain portions 21 and 23 is 2.7 V.

In the cross section of the semiconductor layer 130 shown in FIG. 4B, portions having darker colors illustrate regions having low electron densities; and regions having high electron densities are illustrated by the color becoming lighter. For example, the electron density of a region 130a in FIG. 4B is about $1 \times 10^{15}$ cm$^{-3}$. Also, the electron density of a region 130b is about $5 \times 10^{15}$ cm$^{-3}$; and the electron density of a region 130c is $1 \times 10^{16}$ cm$^{-3}$. In other words, in the semiconductor layer 130 that has a rectangular cross section such as that shown in FIG. 4A, the electron density becomes high away from the side surface 130s that opposes the control electrode 10. As a result, the electron density becomes high at the center in the X-direction of the cross section of the semiconductor layer 130. Therefore, in the vertical transistor 70, the off-current ($I_{OFF}$) flows mainly through the central portion of the semiconductor layer 130.

In the embodiment, in the semiconductor layers 20 and 120 as shown in FIGS. 3A and 3B, the width in the Y-direction of the cross section is formed to be narrower at the center than at the side surfaces 20s and 120s that oppose the control electrode 10. Accordingly, the area of the central portion in the cross-section is smaller for the semiconductor layers 20 and 120 than for the semiconductor layer 130. Thereby, it is possible to reduce the off-current flowing through the central portion for the semiconductor layers 20 and 120.

For example, in the semiconductor layers 20 and 130, the width $W_S$ of the side surfaces 20s and 130s is set to be 24 nanometers (nm); and the width in the X-direction of the side surfaces 20p and 130p is set to be 48 nm. Further, in the semiconductor layer 20, the width $W_{C1}$ of the central portion is set to be half of the width $W_S$ of the side surface. Also, the gate length (the length in the Z-direction of the channel portion) is set to be 210 nm; and the spacing between the control electrode 10 and each of the semiconductor layers is set to be 5 nm. According to the results of a simulation of the value of the off-current at these conditions, the off-current of the semiconductor layer 20 can be reduced to about 60% of that of the semiconductor layer 130.

Thus, for the semiconductor layers 20 and 120 of the vertical transistors 50 and 60 according to the embodiment, the width in the Y-direction of the cross-sectional configuration is narrower at the center than at the side surfaces 20s and 120s that oppose the control electrode 10. Thereby, it is possible to suppress the off-current while maintaining the on-current that is induced in the side surfaces 20s and 120s by the gate bias and flows through the storage channel.

[Second Embodiment]

Figure 5A:
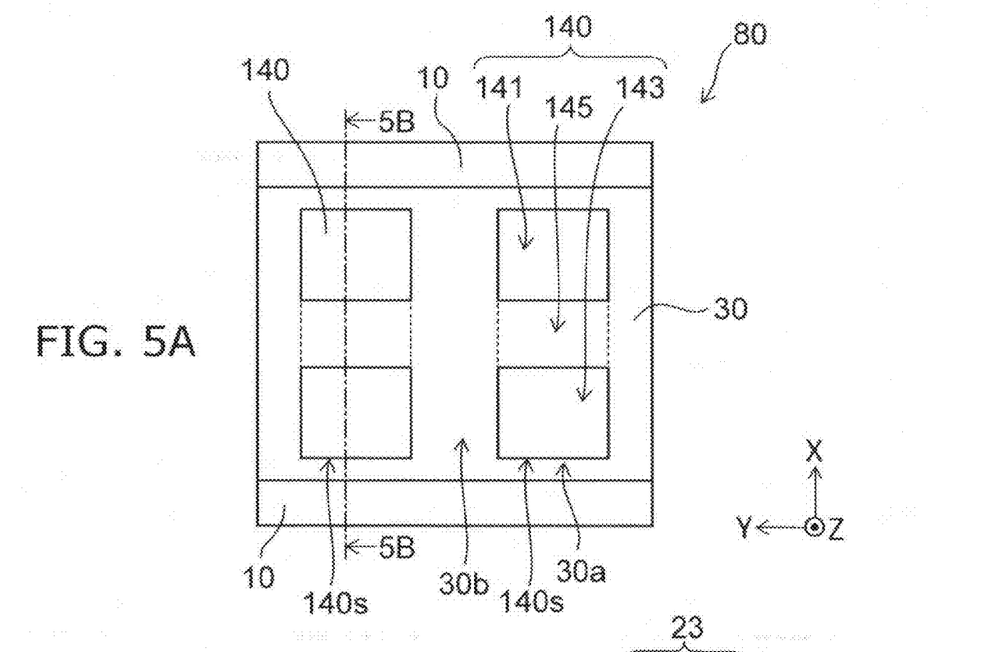
FIGS. 5A to 5C are examples of schematic cross-sectional view showing a semiconductor layer of a vertical transistor according to a second embodiment.
Figures 5B, 5C:
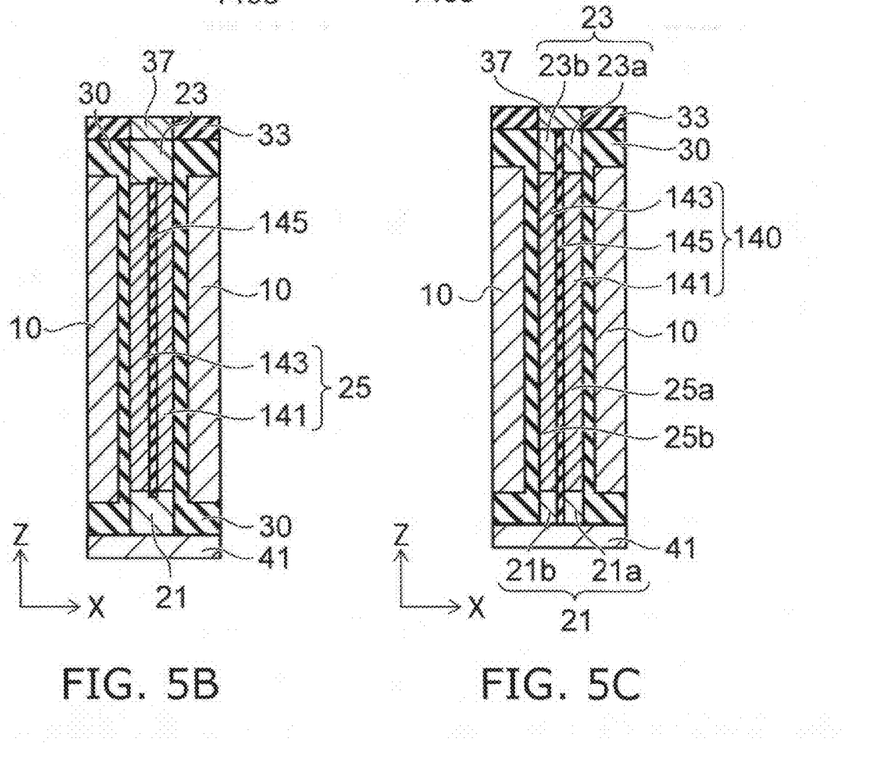

FIGS. 5A to 5B are examples of schematic cross-sectional views showing a semiconductor layer 140 of a vertical transistor 80 according to a second embodiment. FIG. 5C is an example of a schematic cross-sectional view showing a semiconductor layer 150 according to a modification of the second embodiment.

FIG. 5A shows a portion of a cross section along line 2A-2A shown in FIG. 2. Also, FIG. 5B shows a cross section along line 5B-5B shown in FIG. 5A.

As shown in FIG. 5A, the semiconductor layers 140 are provided to be arranged in the Y-direction between two control electrodes 10. In the X-direction, the insulating film 30 is formed in the space between the two control electrodes 10 other than portions occupied by the semiconductor layers 140.

The semiconductor layer 140 includes a first semiconductor portion 141, and a second semiconductor portion 143. An insulating portion 145 is provided between the first semiconductor portion 141 and the second semiconductor portion 143. The first semiconductor portion 141 and the second semiconductor portion 143 are respectively in contact with the control electrodes 10 via the insulating film 30. The first semiconductor portion 141 and the second semiconductor portion 143 are, for example, polysilicon; and the insulating portion 145 is, for example, a silicon oxide film.

The semiconductor layer 140 has, for example, the configuration of the semiconductor layer 130 described above in which the central portion of the semiconductor layer 130 is replaced with the insulating portion 145. In other words, the off-current can be reduced by replacing the central portion, through which the off-current mainly flows, with the insulating portion 145. On the other hand, the width in the Y-direction of a side surface 140s that opposes the control electrode 10 is substantially the same as the width in the Y-direction of the side surface 130s of the semiconductor layer 130. Accordingly, in the vertical transistor 80 as well, the off-current may be suppressed while maintaining the on-current.

The insulating film 30 includes the first portion 30a that is provided between the semiconductor layer 20 and the control electrode 10, and the second portion 30b that is provided between two semiconductor layers 20 adjacent to each other in the Y-direction. The first portion 30a serves as a gate insulator film. The second portion 30b electrically insulates the two mutually-adjacent semiconductor layers 20. In the embodiment, the second portion 30b contacts the insulating portion 145.

As shown in FIG. 5B, the insulating portion 145 extends in the Z-direction through the channel portion 25. The channel portion 25 includes the first semiconductor portion 141 and the second semiconductor portion 143. Here, in the X-direction, the insulating portion 145 is disposed so that the lengths of the first semiconductor portion 141 and the second semiconductor portion 143 are substantially the same. A source-drain portion 21 (a first diffusion layer portion) and a source-drain portion 23 (a second diffusion layer portion) are provided at two ends of the channel portion 25. For example, one end of the insulating portion 145 is positioned inside the source-drain portion 21; and one other end of the insulating portion 145 is positioned inside the source-drain portion 23.

Thus, in the vertical transistor 80, the channel portion 25 is divided into two in the X-direction by the insulating portion 145. Each portion of the channel portion that is divided into two is electrically connected to the global bit line 41 and the local bit line 43 via the source-drain portions 21 and 23.

For example, in the semiconductor layers 140 and 130, the width $W_S$ in the Y-direction is set to be 24 nanometers (nm); and the width in the X-direction is set to be 48 nm. Further, in the semiconductor layer 140, the width in the X-direction of the insulating portion 145 is set to be 12 nm. Also, the gate length (the length in the Z-direction of the channel portion) is set to be 210 nm; and the spacing between the control electrode 10 and each of the semiconductor layers is set to be 5 nm. According to the simulation results of the off-current value at these conditions, the off-current of the semiconductor layer 140 may be reduced to about 90% of that of the semiconductor layer 130.

(Variation of Embodiment)

Next, a modification of the vertical transistor 80 shown in FIG. 5B is shown in FIG. 5C. FIG. 5C shows a cross section along line 5B-5B shown in FIG. 5A. In the example shown in FIG. 5C, the semiconductor layer 140 is divided into two by the insulating portion 145. In other words, the semiconductor layer 140 includes the first semiconductor portion 141, the second semiconductor portion 143, and the insulating portion 145 provided between the first semiconductor portion 141 and the second semiconductor portion 143. The first semiconductor portion 141 and the second semiconductor portion 143 are, for example, polysilicon; and the insulating portion 145 is, for example, a silicon oxide film.

Also, the insulating portion 145 divides not only the semiconductor layer 140 but also the source-drain portions 21 and 23 into two in the X-direction. In other words, in the Z-direction, one end portion of the insulating portion 145 contacts the global bit line 41; and one other end portion contacts the barrier layer 37.

The first semiconductor portion 141 includes source-drain portions 21a and 23a at two ends in the Z-direction. The second semiconductor portion 143 includes source-drain portions 21b and 23b at the two ends in the Z-direction. Also, the first semiconductor portion 141 is electrically connected to the global bit line 41 and the local bit line 43 via the source-drain portions 21a and 23a. The second semiconductor portion 143 is electrically connected to the global bit line 41 and the local bit line 43 via the source-drain portions 21b and 23b.

Figure 6:
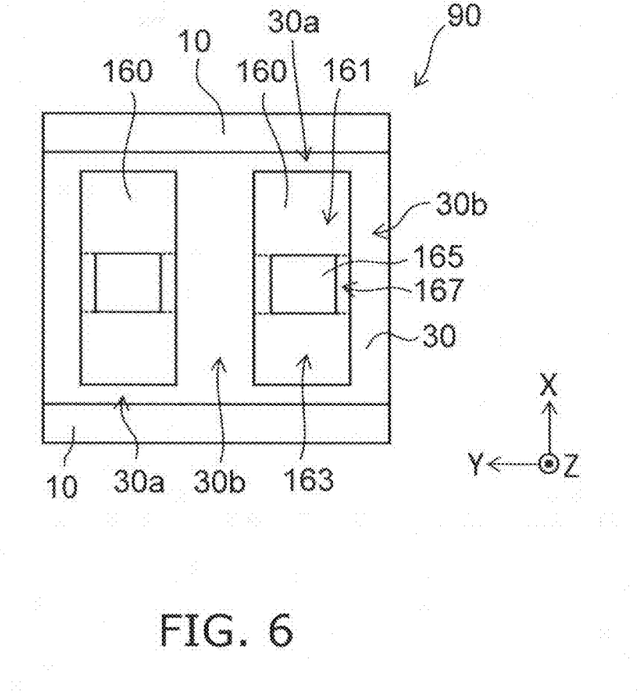
FIG. 6 is an example of a cross-sectional view schematically showing a semiconductor layer of a vertical transistor according to a variation of the second embodiment.

FIG. 6 is an example of a cross-sectional view schematically showing a semiconductor layer 160 of a vertical transistor 90 according to a variation of the second embodiment. FIG. 6 shows a portion of a cross section along line 2A-2A shown in FIG. 2.

As shown in FIG. 6, the semiconductor layers 160 are provided to be arranged in the Y-direction between two control electrodes 10. The insulating film 30 is formed in the space between two control electrodes 10 adjacent to each other in the X-direction other than the portions occupied by the semiconductor layers 160.

The semiconductor layer 160 includes a first semiconductor portion 161, a second semiconductor portion 163, and a third semiconductor portion 167. An insulating portion 165 is provided at the center of the semiconductor layer 160. The insulating portion 165 extends in the Z-direction and is enclosed with the first semiconductor portion 161, the second semiconductor portion 163, and the third semiconductor portion 167. The first semiconductor portion 161 is in contact with one of two control electrodes via the first portion 30a of the insulating film 30. The second semiconductor portion 163 is in contact with the other of the two control electrodes via the first portion 30a. In the X-direction, the third semiconductor portion 167 contacts the first semiconductor portion 161 and the second semiconductor portion 163. Also, in the Y-direction, the third semiconductor portion 167 contacts the second portion 30b of the insulating film 30 and the insulating portion 165.

The semiconductor layer 160 has, for example, the configuration of the semiconductor layer 130 described above in which the central portion of the semiconductor layer 130 is replaced with the insulating portion 165. In other words, the off-current can be reduced by replacing, with the insulating portion 165, the central portion through which the off-current mainly flows. On the other hand, in the X-direction, the widths in the Y-direction of the first semiconductor portion 161 and the second semiconductor portion 163 that oppose the control electrodes 10 are the same as the width in the Y-direction of the side surface 130s of the semiconductor layer 130. Accordingly, in the vertical transistor 90 as well, the off-current can be suppressed while maintaining the on-current.

Figure 7:
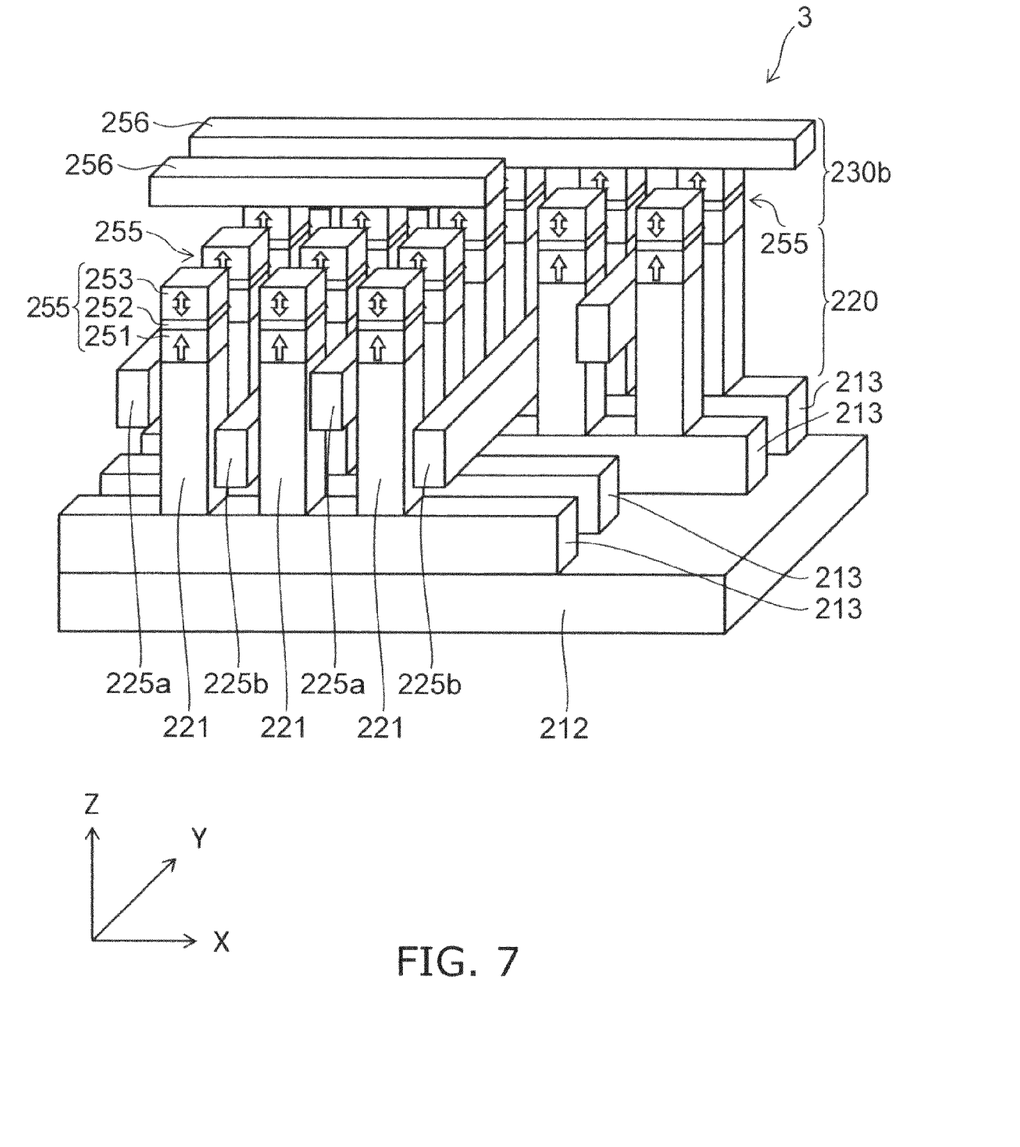
FIG. 7 is an example of a perspective view schematically showing an example of other application of a semiconductor device according to an embodiment

The vertical transistors 50, 60, 80, and 90 according to the embodiment also are applicable to, for example, an integrated circuit device 3 shown in FIG. 7. The integrated circuit device 3 is, for example, an MRAM (Magnetoresistive Random Access Memory).

In the integrated circuit device 3 as shown in FIG. 7, a plurality of local source lines 213 are provided by patterning the upper layer portion of a monocrystalline silicon substrate 212. The local source lines 213 are arranged periodically along the Y-direction. Also, each of the local source lines 213 extends in the X-direction. The local source lines 213 are electrically isolated from each other by, for example, STI (Shallow Trench Isolation), a burying insulation film, an impurity concentration profile, etc. The local source lines 213 may be combined into one. An interconnect selection unit 220 similar to that of the first embodiment described above is provided on the interconnect layer including the local source lines 213. In the embodiment, for example, the channels of the interconnect selection unit 220 are formed by directly patterning a silicon substrate 12. Therefore, the channels are formed of monocrystalline silicon. Then, the on-current can be increased compared to the case where the channels are formed of polysilicon.

Also, in the integrated circuit device 3, a memory unit 230b is provided on the interconnect selection unit 220. In the memory unit 230b, MTJ (Magnetic Tunnel Junction) elements 255 are provided as memory elements on each of semiconductor members 221. The MTJ element 255 is one type of magnetoresistive element. In the MTJ element 255, a fixed layer 251 that is made of a perpendicular magnetization film and connected to the semiconductor member 221 having a fixed magnetization direction, an insulating layer 252, and a memory layer 253 that is made of a perpendicular magnetization film having a variable magnetization direction are stacked in this order from the lower side. Local bit lines 256 that extend in the X-direction are provided on the MTJ elements 255. The local bit lines 256 are disposed in the regions directly above the local source lines 213. The memory layers 253 of the MTJ elements 255 arranged in one column along the X-direction have a common connection with the local bit line 256.

Otherwise, the configuration, the manufacturing method, the operations, and the effects of the embodiment are similar to those of the first embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    two electrodes extending in a first direction, the two electrodes being arranged in a second direction intersecting the first direction;
    at least one semiconductor layer provided between the two electrodes, the semiconductor layer extending in a third direction orthogonal to the first direction and the second direction; and
    an insulating film provided between the two electrodes, and covering side surfaces of the semiconductor layer,
    the semiconductor layer having a shape in a cross section perpendicular to the third direction such that a width in the first direction at a center between the two electrodes is narrower than a width, in the first direction, of portions adjacent to the two electrodes.

2. The semiconductor device according to claim 1, wherein the semiconductor layer has other side surfaces contacting the side surface, and at least one of the other side surfaces in the cross section has a concave surface.

3. The semiconductor device according to claim 1, wherein the semiconductor layer has other side surfaces contacting the side surface, and at least one of the other side surfaces has a recessed portion in the cross section.

4. The semiconductor device according to claim 1, comprises a plurality of semiconductor layers provided between the two electrodes, wherein the plurality of semiconductor layers are arranged in the first direction, and
    the insulating film includes a first portion and a second portion, wherein
    the first portion is provided between each of the plurality of semiconductor layers and any one of the two electrodes, and
    the second portion is provided between two adjacent ones of the plurality of semiconductor layers.

5. The semiconductor device according to claim 4, wherein a width of the second portion in the first direction is wider than a width of the first portion in the second direction.

6. The semiconductor device according to claim 1, wherein
    the semiconductor layer includes two diffusion layer portions and a channel portion, wherein
    the channel portion being provided between the two diffusion layer portions in the third direction, and
    the two electrodes are in contact with the channel portion via the insulating film.

7. The semiconductor device according to claim 6, wherein the two diffusion layer portions have a n-type conductivity.

8. The semiconductor device according to claim 6, further comprising:
    a plurality of first interconnects extending in the second direction;
    a plurality of second interconnects extending in the third direction;
    a third interconnect provided between two adjacent ones of the plurality of second interconnects in the second direction, the third interconnect extending in the first direction; and memory cell provided between the third interconnect and each of the two adjacent ones of the plurality of second interconnects, one of the two diffusion layer portions being connected to one of the plurality of first interconnects, the other of the two diffusion layer portions being connected to one of the plurality of second interconnects.

9. The semiconductor device according to claim 8, wherein the memory cell includes a variable resistance film transitioning reversibly from a first resistance value to a second resistance value due to a voltage applied between the third interconnect and one of the two adjacent ones of the plurality of second interconnects, or due to a current flowing between the third interconnect and the one of the two adjacent ones of the plurality of second interconnects.

* * * * *